(12) United States Patent
Anagnos

(10) Patent No.: US 6,252,159 B1
(45) Date of Patent: Jun. 26, 2001

(54) EMI/RFI AND VIBRATION RESISTANT ELECTRONICS ENCLOSURE

(75) Inventor: Daniel P. Anagnos, Grandview, NY (US)

(73) Assignees: Sony Corporation, Tokyo (JP); Sony Electronics, Inc., Park Ridge, NJ (US)

(*) Notice: Subject to any disclaimer, the term of this patent is extended or adjusted under 35 U.S.C. 154(b) by 0 days.

(21) Appl. No.: 09/233,916

(22) Filed: Jan. 21, 1999

(51) Int. Cl.[7] .................................................. H05K 9/00
(52) U.S. Cl. ............................ 174/35 MS; 428/611; 361/816; 361/818
(58) Field of Search .................. 174/35 R, 35 MS, 174/42; 361/816; 206/521; 428/611, 621, 622, 626, 425.8

(56) References Cited

U.S. PATENT DOCUMENTS

| | | | |
|---|---|---|---|
| H526 | * 9/1988 | Miller | 361/424 |
| 3,735,209 | 5/1973 | Saddler | 317/234 |
| 4,408,255 | * 10/1983 | Adkins | 361/382 |
| 4,609,104 | 9/1986 | Kasper et al. | 206/334 |
| 4,775,867 | 10/1988 | Sokol et al. | 343/786 |
| 4,889,959 | * 12/1989 | Taylor et al. | 174/35 GC |
| 4,931,479 | 6/1990 | Morgan | 521/76 |
| 4,975,762 | 12/1990 | Stradley et al. | 357/74 |
| 5,166,772 | 11/1992 | Soldner et al. | 257/659 |
| 5,190,479 | 3/1993 | Jordi | 439/620 |
| 5,360,941 | * 11/1994 | Roes | 174/35 R |
| 5,388,995 | 2/1995 | Rudy, Jr. et al. | 439/61 |
| 5,398,169 | 3/1995 | Gorenz, Jr. et al. | 361/818 |
| 5,444,297 | 8/1995 | Oshima et al. | 257/691 |
| 5,570,270 | 10/1996 | Naedel et al. | 361/687 |
| 5,650,659 | 7/1997 | Mostafazadeh et al. | 257/660 |
| 5,669,524 | 9/1997 | Loedel | 220/9.1 |
| 5,709,957 | * 1/1998 | Chiang et al. | 428/615 |
| 5,712,038 | * 1/1998 | Yamazaki et al. | 428/411.1 |
| 5,844,166 | * 12/1998 | Halttunen et al. | 174/35 R |
| 5,847,316 | * 12/1998 | Takada | 174/35 MS |

OTHER PUBLICATIONS

CO–NETIC & NITIC Magnetic Shielding Alloys, Brochure.
SORBOTHANE Inc., Brochure Jun. 1995.

* cited by examiner

Primary Examiner—Dean A. Reichard
Assistant Examiner—W. David Walkenhorst
(74) Attorney, Agent, or Firm—Ronald P. Kananen; Rader, Fishman & Grauer

(57) ABSTRACT

A panel used in an enclosure for housing at least one electronic component, and an enclosure made of at least one of such panels is disclosed. The panel includes an electrically conductive layer, a separate, magnetically permeable layer connected to the electrically conductive layer, and a separate, extensionally damped layer covering at least 80 percent of a surface of the panel and attached to one or more of the electrically conductive layer and the magnetically permeable layer, where electrical and magnetic conductivity are maintained between all panels of the enclosure, and a ground is provided between circuitry of the electrical component and the electrically conductive layer.

19 Claims, 2 Drawing Sheets

EMI/RFI AND VIBRATION RESISTANT ELECTRONICS ENCLOSURE

BACKGROUND OF THE INVENTION

Sensitive electronics are often prone to radio frequency interference (RFI) as well as electromagnetic interference (EMI) at frequencies ranging up to several megahertz. The electrical performance of an analog or digital circuit can be impaired significantly by such types of interference. In addition, vibrational energy impinging upon an enclosure containing such circuits and transmitted into the electronic components themselves can impair circuit performance to a degree dependent upon the microphonic sensitivity of the electronic components and the internal wiring used. Sources of the RFI, EMI, and vibrational energy are assumed to be external to the enclosure and may include other high frequency electronics (especially digital circuitry), electrical motors, transformers, AC power lines (and cables), electrical switches, electrical lighting, loudspeaker output, etc. In addition to preventing RF, magnetic and vibrational energy from entering the circuitry contained within the enclosure, it is desirable to prevent any RF or magnetic energy generated by the contained circuitry from leaving the enclosure, where it could affect other sensitive electrical circuits.

Electronics are usually housed within an enclosure formed of either aluminum, steel, or plastic. Plastic enclosures offer no protection from RFI or EMI unless they are sprayed with a highly conductive coating (usually a metal) and properly grounded. This can provide a degree of RFI protection, but offers very little protection from magnetic interference, except at very high frequencies (>100 kHz). Steel enclosures offer some protection from magnetically generated interference, but sacrifice a significant degree of RFI protection due to the fairly poor electrical conductivity of steel at very high frequencies. This can be remedied somewhat by plating the steel with a very conductive metal such as copper. However, steel is still not entirely effective in preventing low frequency (e.g., 60 Hz) magnetic interference, especially if the field strength is high, because of the marginal magnetic permeability of the steel materials typically used. An aluminum enclosure offers good protection from RFI and very high frequency EMI (assuming correct grounding guidelines are followed) due to its high degree of electrical conductivity. Aluminum enclosures, however, offer very little protection from EMI at frequencies below 100 kHz since they are not magnetically permeable, i.e., they are transparent to low frequency magnetic fields. It is apparent that none of the commonly used materials for electronics enclosures offers a high degree of both RFI and EMI protection, particularly EMI protection at low frequencies. In addition, immunity from vibrational energy is rarely addressed correctly in most enclosure designs. Often, materials with dubious damping qualities are used. In most cases, even when the appropriate materials are utilized, the surface area coverage is inadequate to provide any significant amount of vibrational energy damping, particularly at lower frequencies, below 200 Hz. It should be emphasized that usually, immunity from vibrational energy is not addressed at all.

It is therefore an object of the present invention to prevent RF, magnetic and vibrational energy from entering the circuitry contained within an enclosure. It is a further object of the invention to provide an enclosure that prevents entry of such energy, while preventing any RF or magnetic energy generated by the contained circuitry from leaving the enclosure, where it could affect other sensitive electrical circuits. It is yet another object of the invention to provide an enclosure that does not have the detrimental qualities of enclosures formed solely of either aluminum, steel, or plastic.

SUMMARY OF THE INVENTION

The above objects and others are accomplished by a panel for an enclosure for housing at least one electronic component, which includes an electrically conductive layer, a separate, magnetically permeable layer connected to the electrically conductive layer, and a separate, extensionally damped layer covering at least 80 percent of a surface of the panel and attached to one or more of the electrically conductive layer and the magnetically permeable layer.

The electrically conductive layer may be formed of a material conductive at frequencies greater than 100 kHz and include at least one of aluminum, copper-plated steel, plastic which is sprayed with a conductive coating, and plastic which is vapor coated with a conductive coating. The magnetically permeable layer comprises at least one of CO-NETIC® and NETIC® magnetic shielding alloy and is a foil of at least about 0.1 mm in thickness, preferably at least about 0.25 mm. The CO-NETIC® magnetic shielding alloy can be CO-NETIC AA foil, and said NETIC® magnetic shielding alloy can be NETIC S3-6 foil. The magnetic shielding alloy should be able to protect the housed components from low frequency EMI, specifically that below 100 kHz, and magnetic interference below 60 Hz. The magnetic shielding should be hydrogen annealed, especially when it will be subject to bending and other forming.

The extensionally damped layer may include a single pass extruded, thermoplastic alloy damping material, such as ISODAMP® CN, with a thickness of at least about 1.5 mm. Preferably, the thickness of the ISODAMP® CN layer is at least about 3.1 mm. The extensionally damped layer may also be SORBOTHANE®, with a thickness of at least about 3.2 mm. The extensionally damped layer is able to protect the housed components from vibrational energy at high and low frequencies, especially very low frequencies below 200 Hz.

Each of the electrically conductive layer, magnetically permeable layer, and extensionally damped layer are preferably connected using an adhesive material.

The above objects and others are further accomplished by an enclosure for housing at least one electronic component, which comprises at least one panel having properties as detailed above.

The electrically conductive layer is preferably an outermost layer, and the extensionally damped layer is preferably an innermost layer. Electrical and magnetic conductivity must be maintained between all panels of the enclosure, and a ground is provided between circuitry of the electrical component and the electrically conductive layer. A connector, which connects each of the panels together, can provide continuity of electrical conductivity throughout the enclosure.

DESCRIPTION OF THE PREFERRED EMBODIMENT

Figure 1:
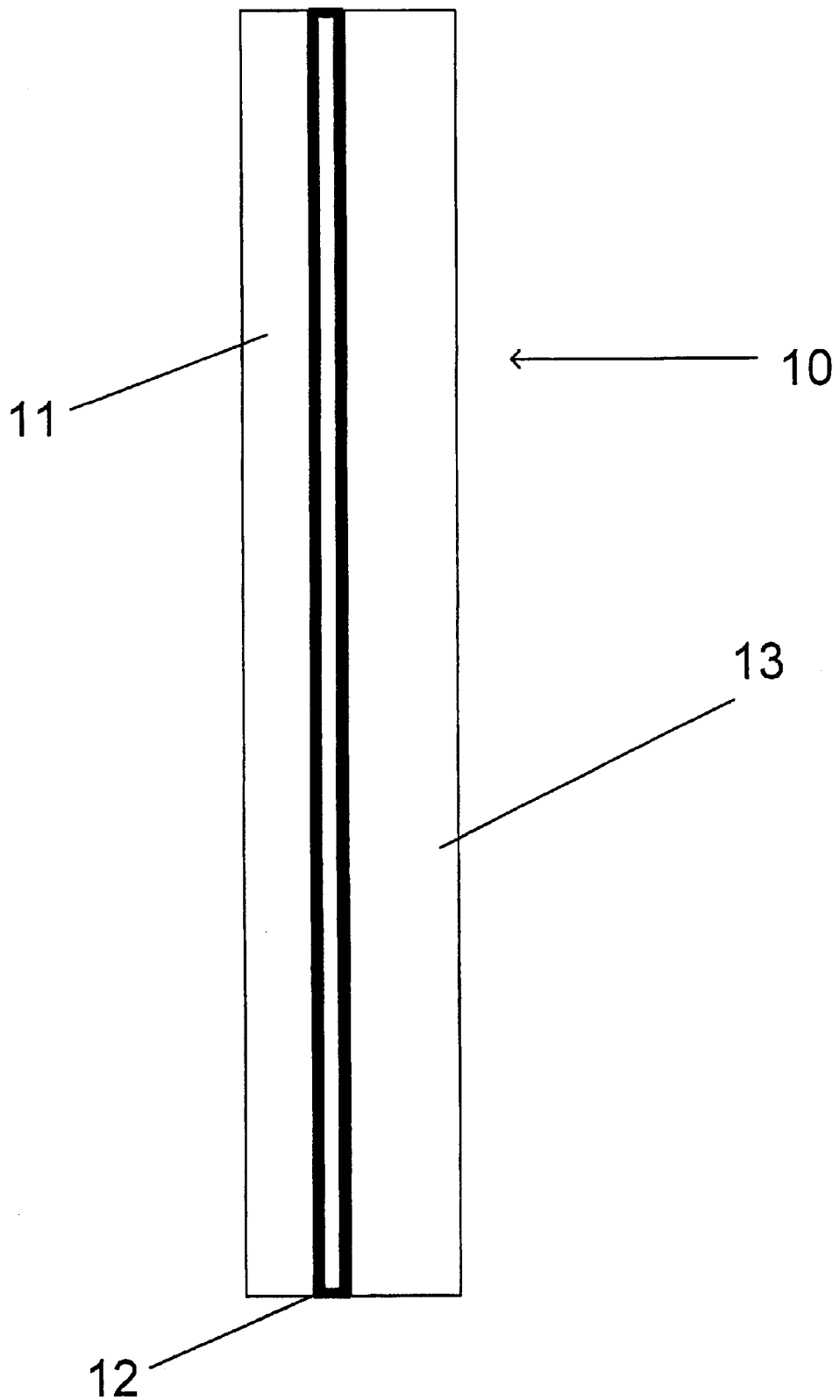
FIG. 1 shows the elements of a typical panel prepared according to the present invention.

The above objects and others are accomplished by the multi-layer enclosure 20 shown in FIG. 2, the layers in each panel of which are described in detail below. A typical panel of the enclosure is shown in FIG. 1. The electrically conductive layer 11 of the composite panel 10 should be formed of a material having a high degree of electrical conductivity, especially at very high frequencies (above 100 kHz). In a preferred embodiment of the invention, the electrically conductive layer 11 comprises aluminum. Other materials that may be used as the electrically conductive layer 11 include copper-plated steel and plastic which is sprayed or vapor-deposited with a highly conductive coating. The electrically conductive layer 11 is typically the outer layer in a panel 10, although it may be surrounded by another suitable layer. When the electrically conductive layer 11 is the outermost layer, it serves both cosmetic and structural purposes, as it is the visible portion and provides mechanical rigidity and form.

Processing of the electrically conductive layer 11 by painting or anodizing should not have a detrimental effect, provided that electrical continuity between the panels 10 is not compromised. Since joints between each panel 10 must maintain a high degree of electrical conductivity, it may be necessary to mask off critical joint areas or provide appropriate secondary processing to ensure good conductivity if painting or anodizing is employed.

The magnetically permeable layer 12 of the composite panel 10 should be formed of a material which exhibits a very high degree of magnetic permeability as well as a moderately high magnetic saturation limit. In a preferred embodiment of the invention, the magnetically permeable layer 12 comprises CO-NETIC® and/or NETIC® magnetic shielding alloys manufactured by Magnetic Shield Corporation (Perfection Mica Co.). The exact alloy and thickness utilized will depend upon the expected strength of the impinging H-field and the degree of shielding (dB of attenuation) required. In most audio electronic enclosures, for example, a foil of 0.1 mm (0.004 in.) in thickness is usually adequate. For critical applications, a foil of 0.25 mm (0.010 in.) in thickness should be used. The "CO-NETIC AA" and "NETIC S3-6" foils are available at varying thickness and are perfection (hydrogen) annealed. They are also available with a pressure sensitive tape backing to facilitate attachment to the electrically conductive or structural layer 11. Detailed specifications for these materials are provided in *Magnetic Shielding Material and Fabrication Guide,* Catalog MG-6, 3–7, 1997, published by Magnetic Shield Corporation, which is incorporated herein by reference. These materials are highly corrosion resistant and do not require any type of painting or surface protection.

Conventional shearing, blanking, stamping, forming and bending operations are acceptable for fabrication. It is important, however, that severe forming or drawing should be avoided, as the magnetic shielding properties can be degraded. Stress annealed sheets of these alloys are available in thicker stock when higher magnetic permeability is necessary or more severe forming is required. The stress annealed sheet materials would require hydrogen annealing following fabrication to attain maximum magnetic shielding characteristics.

The extensionally damped layer 13 should be formed of a material possessing excellent damping characteristics, i.e., very high losses. In a preferred embodiment of the invention, the extensionally damped layer 13 comprises a single pass extruded, high temperature fused thermoplastic alloy damping material produced by EAR Specialty Composites, such as ISODAMP® CN. The properties of ISODAMP® CN are described in Technical Data Sheet TDS-47, published by EAR Specialty Composites, which is incorporated herein by reference. Material thickness should be a minimum of about 1.5 mm (0.060 in.). In a most preferred embodiment of the invention when ISODAMP® CN is used, the material thickness is about 3.1 mm (0.122 in.).

A pressure sensitive adhesive or similar backing is available to facilitate attachment to the other layers of the composite panels 10. It is crucial that at least 80% of the surface area of each enclosure panel 10 be covered by the extensionally damped layer 13 in order to be completely effective. Typically, this layer 13 would be formed by die-cutting individual pieces and then attaching them to the interior surfaces of each panel 10 of the enclosure.

In another preferred embodiment of the invention, a material for this layer is SORBOTHANE®, a thermoset, polyether-based damping material manufactured by Sorbothane Inc. The properties of SORBOTHANE® are provided in Sorbothane, the Ultimate Damping Material, published by Sorbothane Inc., which is incorporated herein by reference. In a most preferred embodiment of the invention when SORBOTHANE® is used, the extensionally damped layer 13 is about 3.2 mm thick, with a durometer 30 hardness and a PSA backing.

Implementation of the multi-layer panel 10 is fairly straightforward and similar to standard electronic enclosure designs except for the multiple layer composite panel construction and several key requirements regarding panel assembly. As previously mentioned, it is critical that the following requirements be met after assembly of the enclosure:

1. Electrical conductivity must be maintained between all panels of the enclosure. In addition, a high quality ground must be provided between the internal circuitry and the electrically conductive layers 11 of the enclosure. Good RF design guidelines should also be followed.

2. Magnetic conductivity, i.e., low reluctance, must be maintained between all panels 10 of the enclosure.

3. At least 80% of the surface area of the inner surface of all panels of the enclosure must be covered by the extensional damping layer 13.

Figure 2:
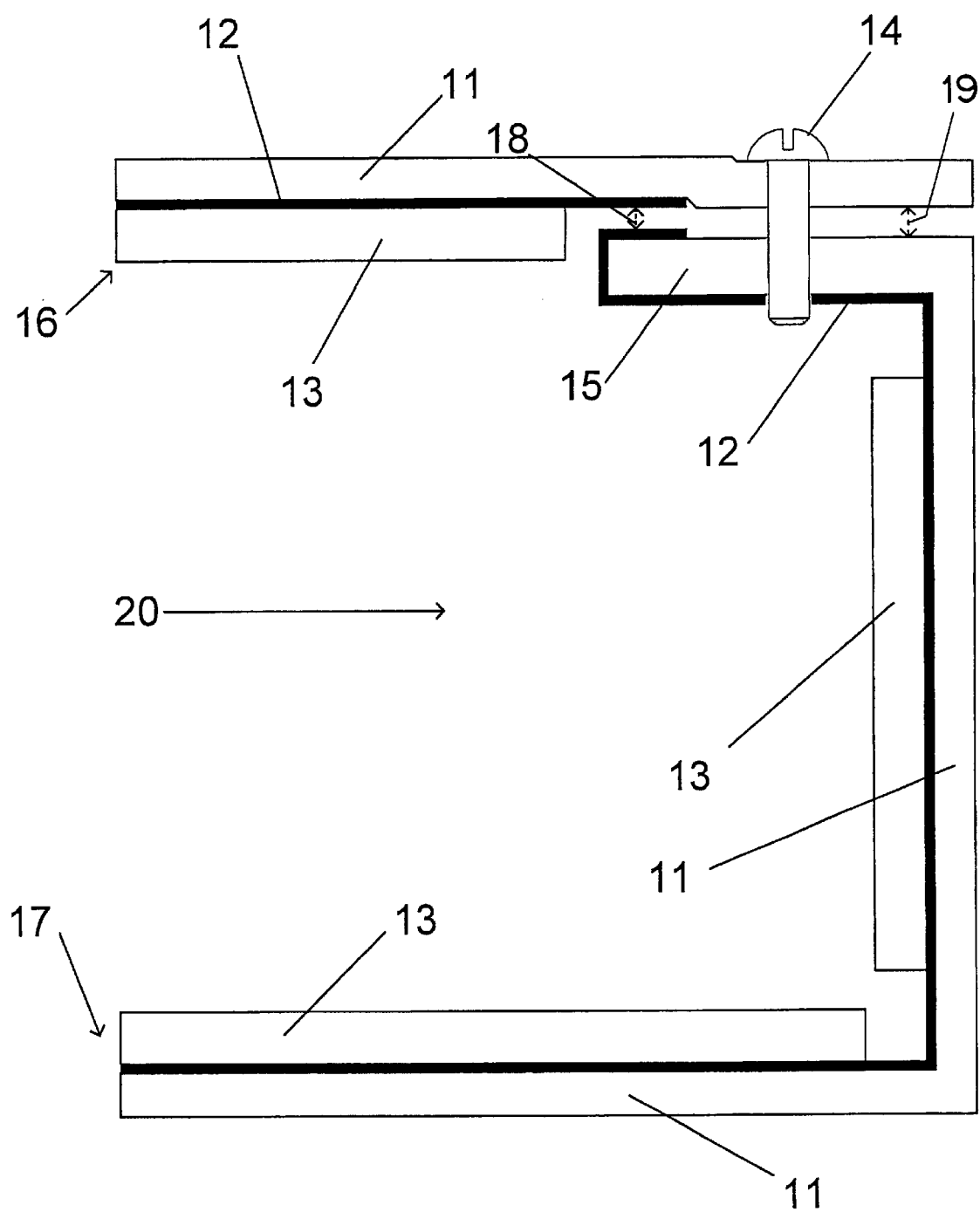
FIG. 2 shows an enclosure made of panels such as that shown in FIG. 1, according to the present invention.

The typical enclosure 20 assembly detail in FIG. 2 meets the above requirements. The magnetically permeable foil 12 is attached, using glue or PSA, to the inside of the outer, electrically conductive layer 11, which also serves as a structural layer. The magnetically permeable foil 12 is wrapped around the edge of the upper flange 15 of the side or rear panel 17. When the top panel 16 is attached, magnetic contact is maintained at magnetic contact point 18 between the foil layers 12 of the two panels 16, 17. Similarly, electrical contact is made at electrical contact point 19 when the two panels 16, 17 are screwed together. A conductive screw 14, e.g., copper, helps to ensure electrical continuity. Extensional damping material 13 is applied to each panel in a secondary operation, before final assembly of the panels. All types of enclosure assembly designs can be accommodated, e.g., two three-sided, U-shaped sections or separate panels attached to a sub-frame. The standard cosmetic front panel could easily be attached afterwards. The exact panel design, attachment method and overall assembly are entirely up to the needs and discretion of the designer.

The above-described invention can be utilized to form either an overall enclosure which houses multiple components and circuitry, or, to form housings for individual electrical or electronic components which may be prone to either external source interference or are actually generators of such interference. In either case, the concepts of insulation are the same, although in the latter case individual shields must be formed. An overall enclosure for multiple components and circuitry may be used when cost savings is desired. It is also possible to use the above-described invention to isolate a single component or circuit from other components and circuitry housed within the same enclosure in ultra-critical applications. Examples include power or signal transformers, sensitive ADC or DAC circuitry, phono-circuitry, digital clocks, microphone amplifier circuitry, etc. It will be necessary to determine the exact material specifications, i.e., composition and thickness of each layer, based upon the degree of expected interference, e.g., external H-field strength, the degree of desired isolation, ease of fabrication, cost, etc. As the position or order of each layer within the composite panel is not critical, it is possible to alter the design based upon the needs of a particular application. For example, an individual transformer housing can be formed with the extensional damping material attached to the outside of the electrically conductive layer, while the magnetically permeable foil is still attached to the inside surface.

Having described an embodiment of the invention, it is to be understood that the invention is not limited to any of the precise embodiments described herein. Various changes and modifications could be effected by one skilled in the art without departing from the spirit or scope of the invention as defined in the appended claims.

What is claimed is:

1. An enclosure for housing at least one electronic component, which comprises at least one panel, wherein each of said at least one panel comprises:
   an electrically conductive layer;
   a separate, magnetically permeable layer, connected to said electrically conductive layer; and
   a separate, extensionally damping layer, covering at least 80 percent of a surface of said panel, and attached to at least one of said electrically conductive layer and said magnetically permeable layer;
   wherein said magnetically permeable layer of said one panel is directly opposed another magnetically permeable layer of another panel to maintain a magnetic contact.

2. An enclosure as set forth in claim 1, wherein said electrically conductive layer is formed of a material conductive at frequencies greater than 100 kHz, and which comprises at least one of aluminum, copper-plated steel, plastic which is sprayed with a conductive coating, and plastic which is vapor coated with a conductive coating.

3. An enclosure as set forth in claim 1, wherein said magnetically permeable layer comprises a magnetic shielding alloy.

4. An enclosure as set forth in claim 1, wherein said extensionally damping layer comprises at least one of a thermoplastic alloy and an elastomeric material containing flexible polyurethane.

5. An enclosure as set forth in claim 1, wherein each of said electrically conductive layer, said magnetically permeable layer, and said extensionally damping layer are connected using an adhesive material.

6. An enclosure as set forth in claim 1, wherein said electrically conductive layer is an outermost layer, and said extensionally damping layer is an innermost layer.

7. An enclosure as set forth in claim 1, wherein electrical and magnetic conductivity are maintained between all panels of said enclosure, and a ground is provided between circuitry of said electrical component and said electrically conductive layer.

8. An enclosure as set forth in claim 1, wherein a connector, which connects each of said at least one panel together, provides continuity of electrical conductivity throughout said enclosure.

9. An enclosure as set forth in claim 1, wherein said electrically conductive layer comprises a first side, and an oppositely faced second side, and said magnetically permeable layer entirely covers said first side of said electrically conductive layer.

10. An enclosure as set forth in claim 9, wherein said electrically conductive layer further comprises intermediate sides that are disposed between said first side and said second side, and said magnetically permeable layer covers at least a portion of one of said intermediate sides.

11. An enclosure as set forth in claim 1, wherein said extensionally damping layer is directly attached to said magnetically permeable layer.

12. An enclosure as set forth in claim 1, wherein said extensionally damping layer is an innermost layer of said enclosure.

13. A method of making an enclosure for housing at least one electronic component, which comprises:
   providing at least one panel, which comprises:
      an electrically conductive layer,
      a separate, magnetically permeable layer, and
      a separate, extensionally damping layer;
   attaching said magnetically permeable layer to said electrically conductive layer;
   attaching said extensionally damping layer to at least one of said electrically conductive layer and said magnetically permeable layer, whereby at least 80 percent of a surface of said panel is covered with said extensionally damping layer;
   maintaining electrical and magnetic conductivity between all of said at least one panel of said enclosure; and
   directly opposing said magnetically permeable layer of said one panel with another magnetically permeable layer of another panel to maintain a magnetic contact.

14. A method as set forth in claim 13, further comprising:
   providing a ground between circuitry of said electrical component and said electrically conductive layer.

15. A method as set forth in claim 13, wherein said maintaining electrical conductivity comprises using an electrically conductive connector to connect each of said at least one panel together.

16. A method according to claim 13, wherein said electrically conductive layer comprises a first side, and an oppositely faced second side, and said step of attaching said magnetically permeable layer to said electrically conductive layer comprises entirely covering said first side of said electrically conductive layer with said magnetically permeable layer.

17. A method as set forth in claim 16, wherein said electrically conductive layer further comprises intermediate sides that are disposed between said first side and said second side, and said step of attaching said magnetically permeable layer to said electrically conductive layer further comprises covering at least a portion of one of said intermediate sides with said magnetically permeable layer.

18. A method as set forth in claim 13, wherein said step of attaching said extensionally damping layer comprises directly attaching said extensionally damping layer to said magnetically permeable layer.

19. A method as set forth in claim 13, wherein said extensionally damping layer is an innermost layer of said enclosure.

* * * * *